United States Patent
Kim

(10) Patent No.: US 8,232,553 B2
(45) Date of Patent: Jul. 31, 2012

(54) SEMICONDUCTOR DEVICE

(75) Inventor: Ki-Tae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 225 days.

(21) Appl. No.: 12/649,557

(22) Filed: Dec. 30, 2009

(65) Prior Publication Data

US 2011/0156031 A1    Jun. 30, 2011

(30) Foreign Application Priority Data

Dec. 29, 2009    (KR) .................. 10-2009-0132514

(51) Int. Cl.
*H01L 23/58*    (2006.01)
(52) U.S. Cl. .................... 257/48; 257/737; 257/E23.011
(58) Field of Classification Search .............. 257/48, 257/734, 737, E23.01, E23.011
See application file for complete search history.

(56) References Cited

U.S. PATENT DOCUMENTS

2009/0134391 A1 *    5/2009    Lin ................................ 257/48
2009/0273097 A1 *    11/2009    Hedler ........................ 257/778

FOREIGN PATENT DOCUMENTS

KR    100794313    1/2008
KR    1020080068346    7/2008

OTHER PUBLICATIONS

Notice of Allowance issued by the Korean Intellectual Property Office on Nov. 30, 2011.

* cited by examiner

*Primary Examiner* — Matthew Landau
*Assistant Examiner* — Colleen E Snow
(74) *Attorney, Agent, or Firm* — IP & T Group LLP

(57) ABSTRACT

A semiconductor device is protected from static electricity introduced through bump pads and probe test pads. The semiconductor device includes a bump pad through which data is inputted, a first electrostatic discharge unit configured to discharge static electricity introduced through the bump pad, a probe test pad through which data is inputted, the probe test pad having a larger size than the bump pad, a second electrostatic discharge unit configured to discharge static electricity introduced through the probe test pad, and an input buffer unit configured to buffer the data transferred through the bump pad or the probe test pad.

5 Claims, 2 Drawing Sheets

SEMICONDUCTOR DEVICE

CROSS-REFERENCE TO RELATED APPLICATIONS

The present application claims priority of Korean Patent Application No. 10-2009-0132514, filed on Dec. 29, 2009, which is incorporated herein by reference in its entirety.

BACKGROUND OF THE INVENTION

Exemplary embodiments of the present invention relate to a semiconductor device design, and more particularly, to a semiconductor integrated circuit (IC) having a chip-on-chip structure.

A wire bonding technology has been used to integrate a control semiconductor IC and a main semiconductor IC into a single package. However, packing semiconductor ICs by wire bonding restricts high speed operations of the semiconductor ICs.

As a way to address this concern, a chip-on-chip package technology is widely used wherein a control semiconductor IC and a main semiconductor IC are stacked in a vertical direction. In other words, the chip-on-chip package technology is a package technology which matches positions of both bump pads between a control semiconductor IC and a main semiconductor IC and directly connects both bump pads without wires. Such a chip-on-chip package technology increases an operating frequency due to high-speed signal transmission, reduces total power consumption, and minimizes an entire chip area.

However, when the chip-on-chip package technology is applied, the bump pad size of the semiconductor IC is too small (e.g., 30-μm×30-μm) to perform a probe test on the bump pads in a test mode. Therefore, in order to achieve a probe test properly, a separate probe test pad having a size of about 60-μm×60-μm is normally desired.

After a wafer level process, a packaging process is performed on the chip-on-chip semiconductor IC in order to use it as a single item. At this time, the IC may be damaged if static electricity is introduced through a pin of the packaged IC. For example, when a person touches a pin of a packaged IC with his/her hands or a test device (e.g., a probe tip for a probe test), a small amount of charges (Q) may be transferred through the IC pin to a bump pad or a probe test pad provided inside the IC. Sine the IC pin has a very small capacitance Cin, a voltage (V) of static electricity transferred through the IC pin can be higher than 1,000 V based on the relation that V=Q/Cin.

Consequently, there is a need for IC designs which can protect ICs from static electricity introduced through a bump pad and a probe test pad provided inside the ICs.

SUMMARY OF THE INVENTION

An embodiment of the present invention is directed to a semiconductor device which is protected from static electricity introduced through bump pads and probe test pads.

In accordance with an embodiment of the present invention, a semiconductor device includes a bump pad through which data is inputted, a first electrostatic discharge unit configured to discharge static electricity introduced through the bump pad, a probe test pad through which data is inputted, the probe test pad having a larger size than the bump pad, a second electrostatic discharge unit configured to discharge static electricity introduced through the probe test pad, and an input buffer unit configured to buffer the data transferred through the bump pad or the probe test pad.

In accordance with another embodiment of the present invention, a semiconductor integrated circuit includes a bump pad through which data is inputted, a first main electrostatic discharge unit configured to primarily discharge static electricity introduced through the bump pad, a probe test pad through which data is inputted, the probe test pad having a larger size than the bump pad, a second main electrostatic discharge unit configured to primarily discharge static electricity introduced through the probe test pad, an auxiliary common electrostatic discharge unit configured to secondarily discharge static electricity introduced through the bump pad or the probe test pad, a switching unit configured to selectively connect the second main electrostatic discharge unit to the auxiliary common electrostatic discharge unit in response to a test mode signal, and an input buffer unit configured to buffer the data transferred through the bump pad or the probe test pad.

DESCRIPTION OF SPECIFIC EMBODIMENTS

Figure 1:
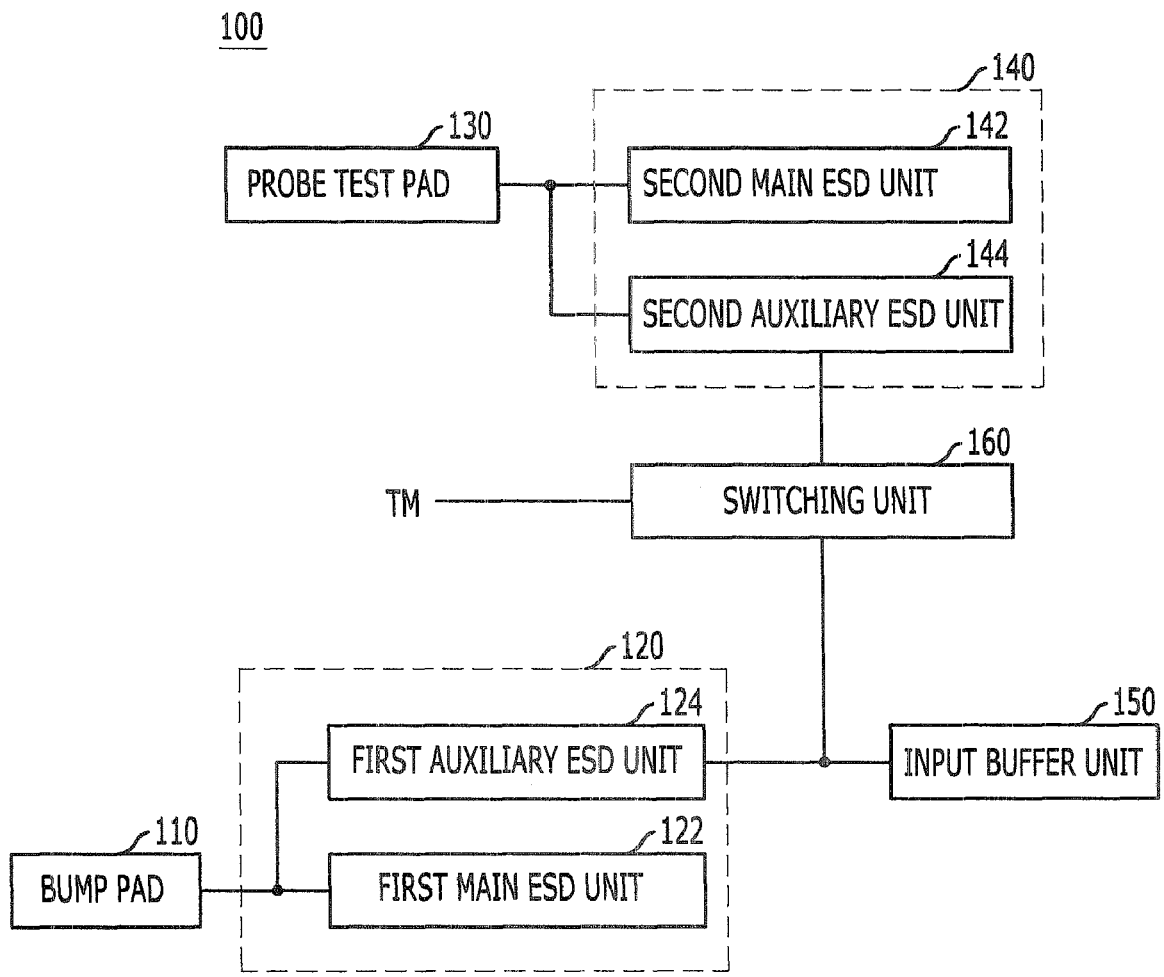
FIG. 1 is a block diagram illustrating a semiconductor IC in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor IC in accordance with an embodiment of the present invention.

Referring to FIG. 1, the semiconductor IC 100 includes a bump pad 110 through which external data is inputted in a normal mode. Static electricity may be introduced through the bump pad 110. For example, when a person touches a pin connected to the bump pad 110, static electricity may be generated and introduced into the semiconductor IC.

The semiconductor IC includes a first electrostatic discharge (ESD) unit 120 configured to discharge static electricity introduced through the bump pad 110. The first ESD unit 120 includes a first main ESD unit 122 and a first auxiliary ESD unit 122. The first main ESD unit 122 is configured to primarily discharge the static electricity introduced through the bump pad 110, and the first auxiliary ESD unit 124 is configured to secondarily discharge the static electricity introduced through the bump pad 110. The first main ESD unit 122 is implemented with an ESD circuit, and the first auxiliary ESD unit 124 is implemented with a charged device model (CDM) circuit. The ESD circuit and the CDM circuit are ESD protection circuits configured to protect an input buffer unit 150, which will be described later, from static electricity introduced from the outside. The static electricity introduced from the outside may be a constant voltage higher than 1,000 V and may not be completely discharged even when the ESD circuit operates. Therefore, with the ESD circuit performing the primary discharge operation, the CDM circuit secondarily performs the discharge operation. As such, the input buffer unit 150 is protected from the static electricity introduced from the outside.

The semiconductor IC further includes a probe test pad 130 through which external data is inputted in a test mode. The probe test pad 130 has sufficient area to accommodate a tip for a probe test (not shown). For example, the probe test pad 130 has an area corresponding to a 60-μm pitch. As it was with the bump pad 110 described above, static electricity may also be introduced through the probe test pad 130.

The semiconductor IC further includes a second ESD unit 140 configured to discharge static electricity introduced through the probe test pad 130. The second ESD unit 140 includes a second main ESD unit 142 and a second auxiliary ESD unit 142. The second main ESD unit 142 is configured to primarily discharge the static electricity introduced through the probe test pad 130, and the second auxiliary ESD unit 144 is configured to secondarily discharge the static electricity introduced through the probe test pad 130. The second main ESD unit 142 is implemented with an ESD circuit, and the second auxiliary ESD unit 144 is implemented with a CDM circuit.

The second ESD unit 140 has the same configuration as the first ESD unit 120. However, the sizes (which effect current driving capacities of respective transistors) of transistors provided in the ESD circuit and CDM circuit may be designed differently.

Meanwhile, the semiconductor IC further includes the input buffer unit 150 configured to buffer data inputted through the bump pad 110 or the probe test pad 130.

In addition, the semiconductor IC further includes a switching unit 160 configured to selectively connect the second ESD unit 140 to the input buffer unit 150 in the test mode.

Figure 2:
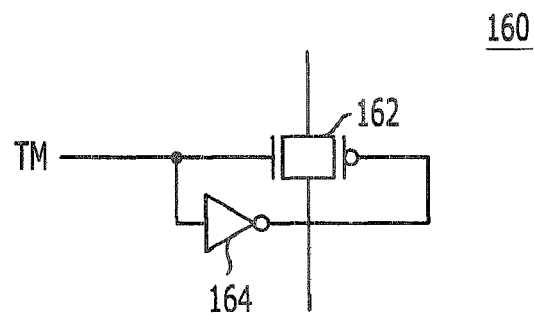
FIG. 2 is a circuit diagram illustrating a switching unit shown in FIG. 1.

FIG. 2 is a circuit diagram illustrating the switching unit 160 shown in FIG. 1.

Referring to FIG. 2, the switching unit 160 includes a transfer gate 162 and an inverter 164. The transfer gate 162 is configured to be turned on/off in response to a logic level of a test mode signal TM. When the test mode signal TM is at a logic high level, the transfer gate 162 is turned on to connect the second ESD unit 140 to the input buffer unit 150. On the other hand, when the test mode signal TM is at a logic low level, the transfer gate 162 is turned off to disconnect the second ESD unit 140 from the input buffer unit 150. When the transfer gate 162 is turned off and the data inputted through the bump pad 110 is transferred through the first ESD unit 120 to the input buffer unit 150, capacitive loads (e.g. parasitic capacitance) caused by the probe test pad 130 and the second ESD unit 140 have no influence on the data. While the above described configuration of the switching unit 160 is illustrated, various modifications from the above described embodiments are also possible.

In the semiconductor IC 100 in which the bump pad 110 and the probe test pad 130 are separately provided, since the probe test pad 130 and the input buffer unit 150 are selectively connected together by the switching unit 160, the second ESD unit 140 is disposed at a suitable position.

Hereinafter, the operation of the semiconductor IC having the above-described configuration in accordance with the embodiment of the present invention will be described in detail.

When static electricity is introduced through the bump pad 110, the introduced static electricity is primarily discharged by the first main ESD unit 122 and secondarily discharged by the first auxiliary ESD unit 124. Therefore, the input buffer unit 150 is safely protected from the static electricity introduced through the bump pad 110.

On the other hand, when the switching unit 160 is turned on in response to the activated test mode signal TM, static electricity introduced through the probe test pad 130 is primarily discharged by the second main ESD unit 142 and secondarily discharged by the second auxiliary ESD unit 144. Therefore, the input buffer unit 150 is safely protected from the static electricity introduced through the probe test pad 130.

Next, a semiconductor IC in accordance with another embodiment of the present invention will be described with reference to FIG. 3.

The volume of the semiconductor IC in accordance with another embodiment of the present invention is smaller than the volume of the above-described semiconductor IC according to an embodiment of the present invention.

Figure 3:
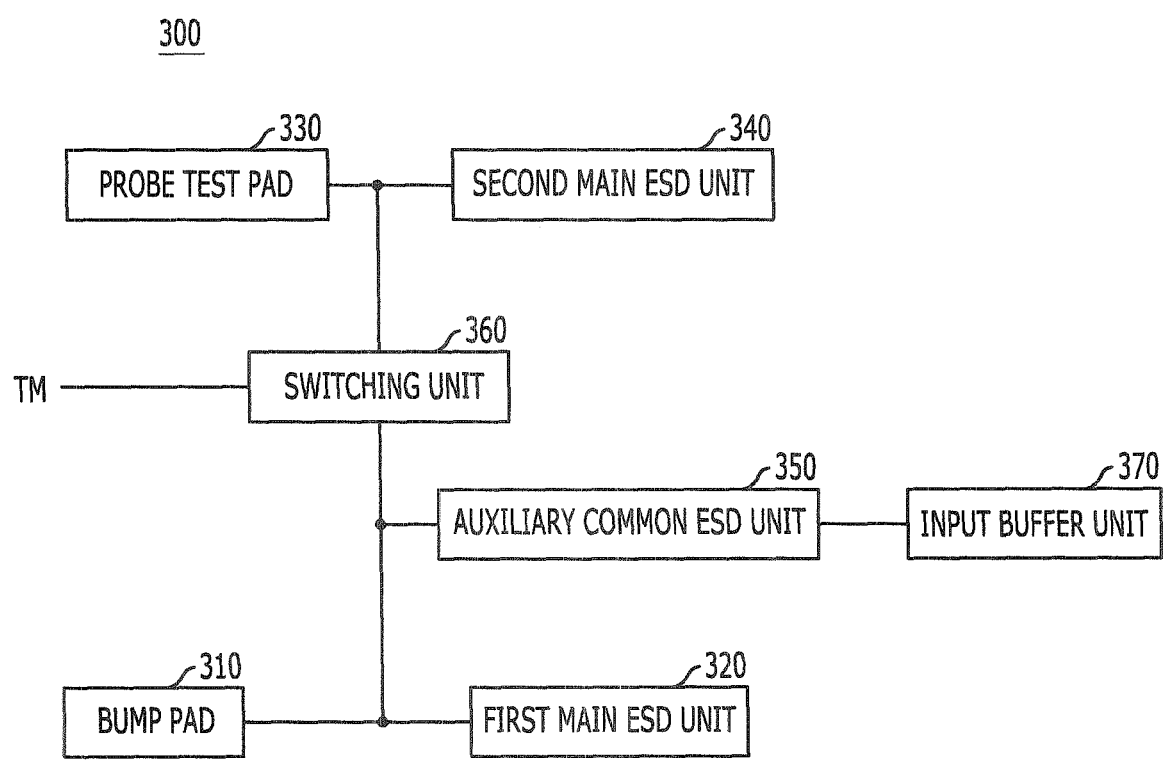
FIG. 3 is a block diagram illustrating a semiconductor IC in accordance with another embodiment of the present invention.

Referring to FIG. 3, the semiconductor IC 300 includes a bump pad 310 through which data is inputted in a normal mode. Static electricity may be introduced through the bump pad 310.

The semiconductor IC 300 further includes a first main ESD unit 320 configured to primarily discharge the static electricity introduced through the bump pad 310. The first main ESD unit 320 may be implemented with an ESD circuit.

The semiconductor IC 300 further includes a probe test pad 330 through which data is inputted in a test mode. The probe test pad 330 has a sufficient area (e.g., 60-μm pitch) to accommodate a tip for a probe test (not shown). Static electricity may also be introduced through the probe test pad 330.

The semiconductor IC 300 further includes a second main ESD unit 340 configured to primarily discharge static electricity introduced from the outside through the probe test pad 330. Like the first main ESD unit 320, the second main ESD unit 340 may be implemented with an ESD circuit.

In addition, the semiconductor IC 300 further includes an auxiliary common ESD unit 350 configured to secondarily discharge static electricity introduced from the outside through the bump pad 310 or the probe test pad 330. The auxiliary common ESD unit 350 may be implemented with a CDM circuit. Since the auxiliary ESD unit 350 is commonly used to further discharge any static electricity passed through the first and second main ESD units 320 and 340, the overall space (e.g., in volume) occupied by the semiconductor IC in accordance with another embodiment of the present invention becomes smaller than the overall space occupied by the semiconductor IC above-described in accordance with the embodiment of the present invention.

Moreover, the semiconductor IC 300 further includes a switching unit 360 configured to selectively connect the second main ESD unit 340 to the auxiliary common ESD unit 350 in response to a test mode signal TM. That is, when the test mode signal TM, which can be generated by an internal circuit (not shown) of the semiconductor IC 300, is at a logic low level, the switching unit 360 is opened. On the other hand, when the test mode signal TM transits to a logic high level, the switching unit 360 is closed. Since the switching unit 360 has the same configuration as the switching unit 160 of FIG. 2, detailed description thereof is omitted.

The semiconductor IC 300 further includes an input buffer unit 370 configured to buffer data transferred through the bump bad 310 or the probe test pad 330 and transfer the buffered data to an internal circuit.

Hereinafter, the operation of the semiconductor IC having the above-described configuration in accordance with the embodiment of the present invention is described in detail.

When static electricity is introduced through the bump pad 310, the introduced static electricity is primarily discharged by the first main ESD unit 320 and secondarily discharged by the auxiliary common ESD unit 350. Therefore, the input buffer unit 370 is safely protected from the static electricity introduced through the bump pad 310.

On the other hand, when the switching unit 360 is turned on in response to the activated test mode signal TM, static electricity introduced through the probe test pad 330 is primarily discharged by the second main ESD unit 340, passes through the switching unit 360, and is secondarily discharged by the auxiliary common ESD unit 350. Therefore, the input buffer unit 370 is safely protected from the static electricity introduced through the probe test pad 330.

In the semiconductor ICs including the bump pad and the probe test pad in accordance with the exemplary embodiments of the present invention, even though static electricity is introduced through the respective pads, the internal circuits are safely protected by the arrangement of the ESD protection circuits (ESD circuit and CDM circuit) according to the exemplary embodiments.

In accordance with the exemplary embodiments of the present invention, the ESD protection circuits (ESD circuits, CDM circuits, etc.) are effectively arranged with the bump pad, the probe test pad, and the input buffer unit of the semiconductor IC. Therefore, the input buffer unit is protected from the static electricity introduced through the bump pad and the probe test pad, thereby improving the operation reliability of the semiconductor IC.

While the present invention has been described with respect to the specific embodiments, it will be apparent to those skilled in the art that various changes and modifications may be made without departing from the spirit and scope of the invention as described in the following claims.

What is claimed is:

1. A semiconductor device, comprising:
   a bump pad through which data is inputted;
   a first electrostatic discharge unit configured to discharge static electricity introduced through the bump pad;
   a probe test pad through which data is inputted, the probe test pad having a larger size than the bump pad;
   a second electrostatic discharge unit configured to discharge static electricity introduced through the probe test pad;
   an input buffer unit configured to buffer the data transferred through the bump pad or the probe test pad; and
   a switching unit configured to selectively connect the second electrostatic discharge unit to the input buffer unit depending on whether the semiconductor device operates in a test mode.

2. The semiconductor device of claim 1, wherein the first and second electrostatic discharge units comprise at least one of an electrostatic discharge (ESD) circuit or a charged device model (CDM) circuit.

3. A semiconductor integrated circuit, comprising:
   a bump pad through which data is inputted;
   a first main electrostatic discharge unit configured to primarily discharge static electricity introduced through the bump pad;
   a probe test pad through which data is inputted, the probe test pad having a larger size than the bump pad;
   a second main electrostatic discharge unit configured to primarily discharge static electricity introduced through the probe test pad;
   an auxiliary common electrostatic discharge unit configured to secondarily discharge static electricity introduced through the bump pad or the probe test pad;
   a switching unit configured to selectively connect the second main electrostatic discharge unit to the auxiliary common electrostatic discharge unit in response to a test mode signal; and
   an input buffer unit configured to buffer the data transferred through the bump pad or the probe test pad.

4. The semiconductor integrated circuit of claim 3, wherein the first and second main electrostatic discharge units comprise an electrostatic discharge (ESD) circuit.

5. The semiconductor integrated circuit of claim 3, wherein the auxiliary common electrostatic discharge unit comprises a charged device model (CDM) circuit.

* * * * *